United States Patent [19]

Southwick

[11] 4,129,827

[45] Dec. 12, 1978

[54] AMPLITUDE PROBABILITY DETECTOR

[76] Inventor: Roger A. Southwick, 8502 E. Mabel Pl., Tucson, Ariz. 85715

[21] Appl. No.: 688,441

[22] Filed: May 20, 1976

[51] Int. Cl.² .......................................... G01R 23/16
[52] U.S. Cl. .................................... 324/77 A; 328/116
[58] Field of Search ............. 324/77 A; 328/117, 116; 340/347; 307/235; 330/127, 129, 138

[56] References Cited

U.S. PATENT DOCUMENTS

| | | | |
|---|---|---|---|
| 2,752,589 | 6/1956 | De Long | 324/103 R |
| 3,452,278 | 6/1969 | Myers | 324/77 A |
| 3,465,247 | 9/1969 | Kubo | 324/77 A |
| 3,532,977 | 10/1970 | Giordano | 324/77 A |
| 3,634,688 | 1/1972 | DiRocco | 328/116 |

*Primary Examiner*—M. Tokar
*Attorney, Agent, or Firm*—Nathan Edelberg; Robert P. Gibson; Saul Elbaum

[57] ABSTRACT

The invention relates to an apparatus and a method for measuring the amplitude statistics, particularly the amplitude probability distribution, of radiated electromagnetic signals which have been processed by a radio receiver. In other modes of use, such a distribution of electrical signals in a conductor can be measured.

9 Claims, 1 Drawing Figure

AMPLITUDE PROBABILITY DETECTOR

BACKGROUND OF THE INVENTION

Prior art techniques and apparatus for detecting amplitude statistics have usually involved measurement and analysis of amplitude probability distribution by presetting a threshold level and then determination of the probability of signals exceeding that level, i.e., the probability of a signal exceeding a preset threshold level during a given time. Since the probability variable is expressed as a logarithmic function, these prior techniques and apparatus have shared the disadvantages of providing data which is difficult to compare or analyze. Other apparatus are complex, expensive, suitable only for laboratory use, and/or deficient in providing a real time output. These prior techniques and apparatus were also not particularly adaptable for use with external output devices, such as x-y plotters, paper tape punch devices, magnetic tape recorders, and the like. Further, these prior techniques and apparatus did not effectively provide allowances either for signal degradation attributable to overloading the receiver which processes the signal input sent to the apparatus.

SUMMARY OF THE INVENTION

The present invention overcomes the deficiences of prior art practices and apparatus by providing an inexpensive amplitude probability detector suitable for field use with conventional field intensity receivers, spectrum analyzers, or direct input probes. In analyzing amplitude probability distribution (APD) data, the detector of the present invention provides data that permits comparison of threshold levels at a preset probability. The threshold levels are expressed as a linear function (rather than comparing the logarithmic variations of probability at a constant threshold), thereby greatly simplifying the comparison or analysis of the APD data. This preset probability feature of the invention provides a uniform data format since the probability axis and scale of the plotter can be made to coincide with the preset probabilities of the detector.

A further advantage of the invention resides in its digital circuitry which renders the invention versatile and readily augmentable by complementary circuitry. For example, the invention can include circuitry which provides a fully automatic ability so that threshold levels associated with a plurality of preset probabilities can be sequentially measured. Alternatively, circuitry could be added to measure interpulse spacing distribution, pulse duration distribution, average crossing rate, or such other factors as are known to the art. This advantage greatly enhances the utility of the invention.

BRIEF DESCRIPTION OF THE DRAWING

The drawing is a diagram which illustrates the amplitude probability distribution (APD) detector system in functional block diagram form.

DESCRIPTION OF THE PREFERRED EMBODIMENT

Figure 1:
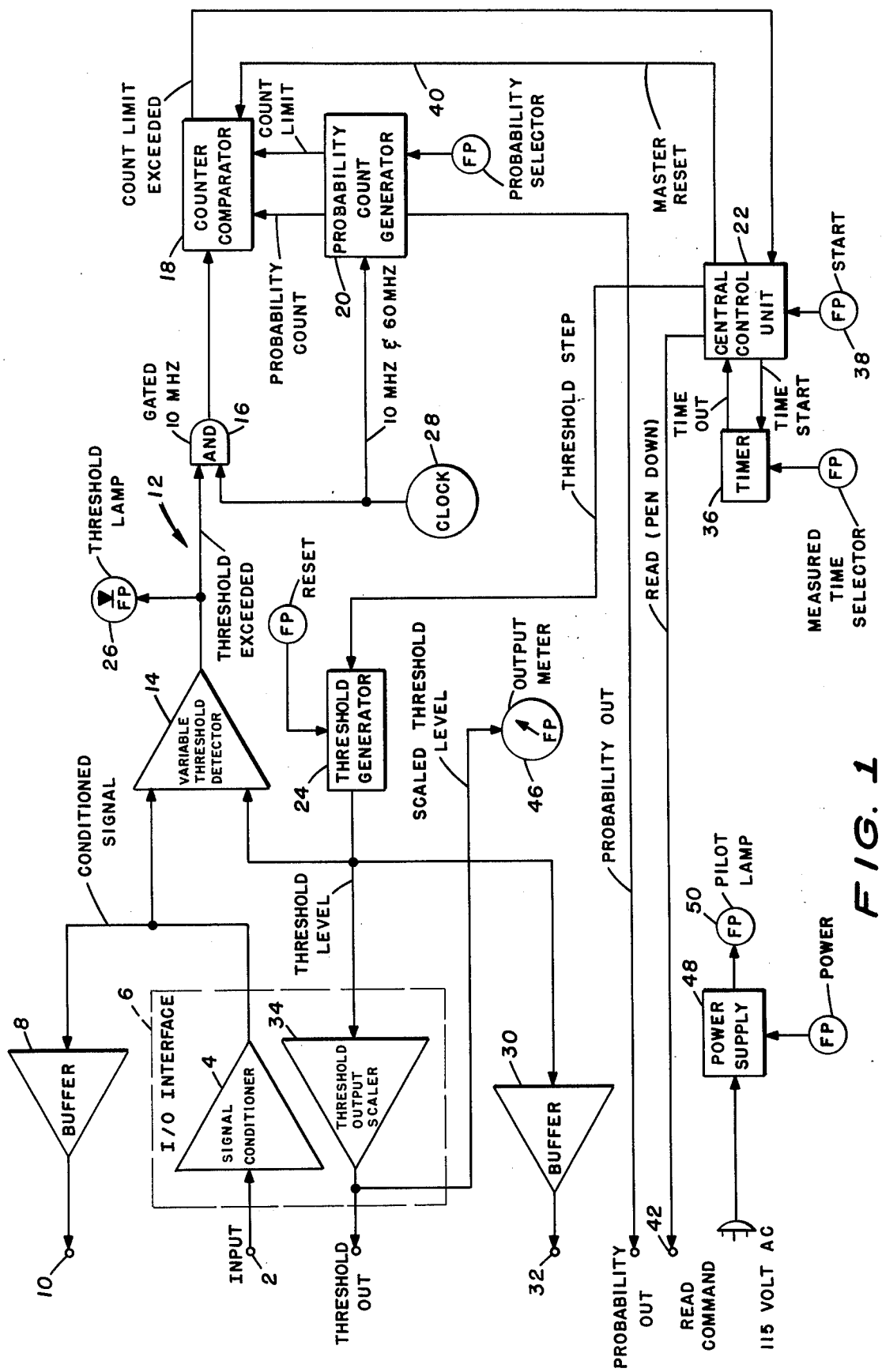

Referring now to the drawing, input 2 is shown entering a signal conditioner 4 of I/O interface 6. The input 2 represents an electromagnetic signal processed by a radio receiver (not shown) or an electrical signal in a conductor (not shown). In either case, the voltage of the signal at input 2 is likely of a value incompatible with the circuit elements of the invention. The signal conditioner 4 thus modifies the input voltage value such that its output is always within a standardized voltage range and may be further processed. The conditioned signal is sent to a buffer 8 after which it is connected to an output plug 10 for monitoring purposes and is also sent to feedback loop 12 via variable threshold detector 14. The feedback loop 12 also comprises a gate 16, a counter comparator 18 connected to a probability count generator 20, a central control unit 22, and a threshold generator 24.

In operation, a threshold level is generated by the threshold generator 24. This threshold level is fed into the detector 14 together with the conditioned signal from the signal conditioner 4. The input signal is compared to the threshold level in the detector 14 to determine whether the conditioned signal exceeds the threshold level. When the threshold is exceeded, a constant-amplitude pulse is produced which has the ability to activate a device 26, such as a lamp, indicating that the threshold level has been exceeded. The pulse, which lasts as long as the threshold is exceeded, is then gated with 10 MHz clock pulses from a 60 MHz crystal clock 28 (which has both 10 MHz and 60 MHz outputs) in gate 16. The output from the gate 16 can thus be considered a count which represents the probability that the conditioned signal excedds the threshold level. For example, should there be a zero count from the gate 16, the probability of the conditioned signal exceeding the threshold level is zero, whereas a ten million count would indicate a probability of unity or certainty (the conditioned signal always exceeding the threshold level). A second count is generated by the probability count generator 20. This second count is effected by sub-dividing the clock pulses emanating from the clock 28 according to a preset probability, i.e., with the clock 28 producing an output at 10 MHz, a 0.0001 preset probability will cause the second count to be 1000. The invention provides for preset probabilities of 0.0001, 0.0005, 0.001, 0.01, 0.02, 0.05, 0.1, 0.2, 0.3, and 0.4 (the latter two probabilities being accomplished by using a clock output of 60 MHz instead of 10 MHz). The second count (representing the preset probability count from probability count generator 20) is then compared to the count from the gate 16 in counter comparator 18 to produce a difference count. Provision is made for establishing a difference count limit which when exceeded by the difference count (within a given period of time) will produce a fixed threshold level step. The fixed threshold level step is 2% of the standardized voltage range at the input to the variable threshold detection. A count limit equal to 5% of the probability count has been provided in the circuitry of the probability count generator 20. Assuming the count from the gate 16 to be zero and the preset probability being set at 0.001 thereby producing a preset probability count of 10,000 the difference count will be 10,000. The count limit would then be 5% of 10,000 or 500. Once the difference count exceeds 500 a signal is then sent to the central control unit 22 to adjust the threshold level generated by one step, resets the count difference to zero and repeat the process. As the threshold level is lowered by this process the count from gate 16 will increase and the difference count will decrease. When the difference count becomes less than the count limit within a preset time interval of 1, 5 or 50 seconds the process stops. The output of the threshold generator 24 is then fed via buffer 30 to an output plug 32 and is also fed to a threshold output scaler circuit 34 which provides the threshold output to an amplitude meter, Y-axis of a plotter, or other like (not shown) recording apparatus. The signal conditioner 4 and the threshold output scaler circuit 34 are elements on a single replaceable I/O interface 6.

The central control unit 22 is time-controlled by timer 36. The timer 36 is started by activating a start switch 38 of the central control unit 22 and transmits a signal back to said central control unit 22 at the end of a preselected time interval, which interval has been set either at 1, 5 or 50 seconds. Amplitude statistics can thus be averaged over differing time intervals.

The central control unit 22 has an output line 40 which serves to reset the counter comparator 18 (to zero at the end of each preselected time interval) and the threshold generator 24 when the preset probability is changed. A read command output 42 is also provided which indicates when the finally adjusted threshold level has been determined. Where the output device (not shown) is a plotter, this signal indicates that the pen should be dropped to the paper to make a mark. As has been previously stated, the output device can be a magnetic tape recorder, a paper tape punch, or such similar apparatus.

An analog output 44 representing the preset probability count is also provided as a scaled threshold output meter 46 from the threshold output scaler circuit 34. Power is supplied by 115 volt AC fed into a power supply 48 provided with a pilot lamp 50 which indicates the power on condition.

It is to be understood that the invention may be practiced other than as explicitly described hereinabove without departing from the spirit of the invention and the scope of the appended claims.

What is claimed is:

1. An amplitude probability detector for selectively measuring the amplitude probability distribution of an input signal, comprising:
    means for presetting a probability within the probability distribution range; and,
    means operably connected and responsive to the probability presetting means for generating and adjusting a signal threshold level such that the probability of the input signal exceeding the threshold level is equal to the preset probability.

2. The amplitude probability detector of claim 1 and further comprising:
    means for automatically changing the value of the preset probability to successive probability values within the probability distribution range, thereby generating corresponding threshold levels for preset probabilities throughout the probability distribution range.

3. An amplitude probability detector for selectively measuring the amplitude probability distribution of an input signal, comprising:
    means for presetting a probability within the probability distribution range; and,
    means operably connected and responsive to the probability presetting means for generating and adjusting a signal threshold level such that the probability of the input signal exceeding the threshold level is equal to the preset probability, wherein the threshold level adjusting means includes a feedback loop comprising:
    a threshold generator for producing the signal threshold level;
    a variable threshold detector for receiving as inputs the input signal and the threshold level produced by the threshold generator, said variable threshold detector producing a pulse during the time when the input signal exceeds the threshold level;
    means for generating clock pulses;
    a probability count generator for sub-dividing the generated clock pulses such that the ratio of sub-divided pulses to clock pulses is equal to the preset probability;
    a gate, having as inputs the generated clock pulses and the variable threshold detector pulse output;
    a counter generator, having as inputs the gate output and the probability count generator output, said counter comparator comparing the number of pulses from the gate with the number of pulses from the probability count generator and producing the difference between said numbers as a difference count, and,
    a central control unit, having as an input the difference count, said central control unit converting the difference count into a threshold step which is fed into the threshold generator in order to adjust the threshold level.

4. The amplitude probability detector of claim 3 and further comprising:
    timer means connected to said central control unit for selecting a time period over which the difference count is taken.

5. The amplitude probility detector of claim 3 and further comprising:
    an analog probability output generated by the probability count generator;
    threshold output scaler circuitry for receiving the signal threshold level generated by the threshold generator and scaling the signal threshold level;
    a read command output from the central control unit for indicating the time at which the adjusted final threshold level associated with a preset probability has been determined; and,
    a threshold-exceeded output device for indicating when the variable threshold detector is producing a pulse.

6. The amplitude probability detector of claim 5 and further comprising:
    a signal conditioner for scaling the input signal to a voltage which can be processed by the detector.

7. The amplitude probability detector of claim 6 and further comprising:
    an I/O interface unit comprised of the signal conditioner and threshold output scaler circuitry; and,
    a buffer arrangement connected between said I/O interface unit and the feedback loop, said buffer arrangement producing buffered outputs from the signal conditioner and from the threshold generator before the signal threshold level enters the threshold output scaler circuitry.

8. The amplitude probability detector of claim 7, wherein the central control unit further comprises:
    a master reset connection for resetting the counter comparator; and,
    a time start connection for starting the timer.

9. A method for measuring the amplitude probability distribution of an input signal comprising the steps of:
    selecting a preset probability within the probability distribution range;
    generating a first count of pulses which should be expected based on the preset probability selected;

generating a signal threshold level;

generating a second count of pulses based on the time the input signal exceeds the signal threshold level;

comparing the first and second counts of pulses to determine a difference count; and, up-dating the signal threshold level until the difference count is reduced to a predetermined count limit.

* * * * *